United States Patent [19]

Carrick

[11] Patent Number: 4,983,958

[45] Date of Patent: Jan. 8, 1991

[54] VECTOR SELECTABLE COORDINATE-ADDRESSABLE DRAM ARRAY

[75] Inventor: Paul Carrick, Los Gatos, Calif.

[73] Assignee: Intel Corporation, Santa Clara, Calif.

[21] Appl. No.: 149,710

[22] Filed: Jan. 29, 1988

[51] Int. Cl.⁵ .............................................. G09G 1/02
[52] U.S. Cl. ...................... 340/799; 340/798; 364/200; 364/255.1; 364/900; 364/955
[58] Field of Search ............... 340/799, 798, 789, 724, 340/726, 744, 747, 750; 364/518, 521, 200 MS File, 255.1 MS File, 900 MS File, 955 MS File

[56] References Cited

U.S. PATENT DOCUMENTS

| | | | |
|---|---|---|---|
| 4,038,646 | 7/1977 | Mehta | 307/269 |
| 4,644,503 | 2/1987 | Bantz et al. | 364/521 |
| 4,742,474 | 5/1988 | Knierim | 340/799 |
| 4,745,407 | 5/1988 | Costello | 340/799 |
| 4,766,431 | 8/1988 | Kobayashi et al. | 340/799 |
| 4,773,026 | 9/1988 | Takahara et al. | 340/747 |
| 4,845,640 | 7/1989 | Ballard et al. | 340/798 |

Primary Examiner—Jeffery A. Brier
Attorney, Agent, or Firm—Blakely, Sokoloff, Taylor & Zafman

[57] ABSTRACT

An improved memory organization system is described. The stored data is specially transformed so that a data bus can carry either a row or column vector of data equally well. The improved memory organization is contained in a computer system, where a computer processor is coupled to memory devices by a bus interface unit and a multiplex address bus to access vectors of data. The memory devices are enabled by the bus interface unit and a decoder which operate in combination to allow during each fetch that no more than one storage device per section of the data bus be enabled. Once a vector is fetched, it is sent through the data bus to the bus interface's barrel shifter where the data is properly transformed from its physical positioning to its logical positioning. The aligned vector is then sent to the computer processor. This invention is particularly well suited for manipulating pixel information. Slight variations on the present invention make it useful for both bit plane and packed pixel selectability. Other slight variations allow for arrays having three for more logical dimensions.

29 Claims, 8 Drawing Sheets

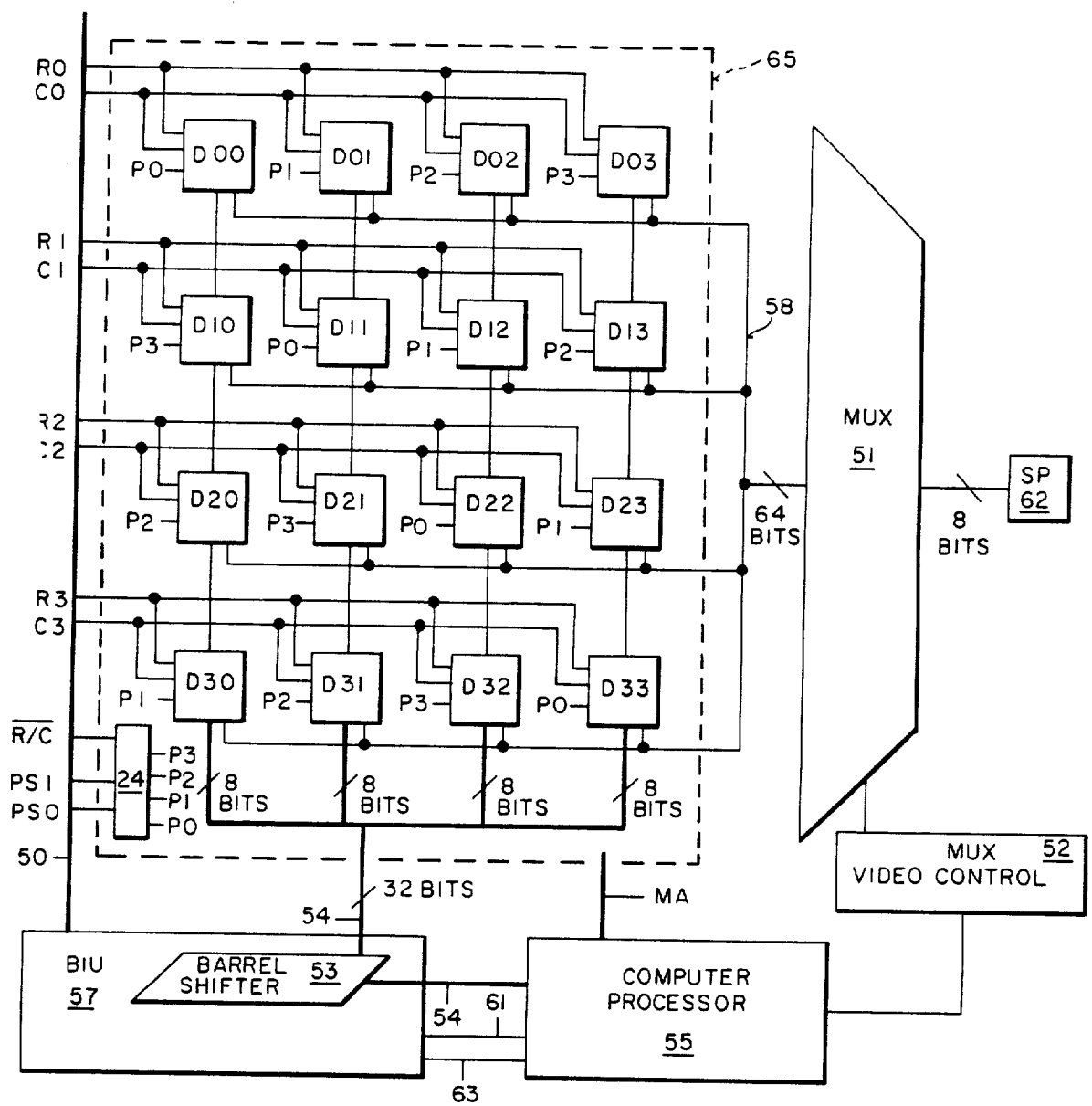
FIG_1

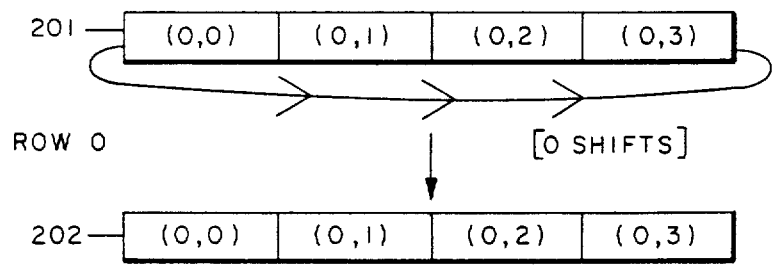
FIG_2A
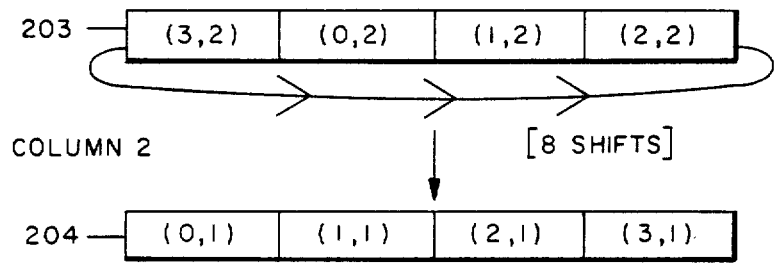
FIG_2B
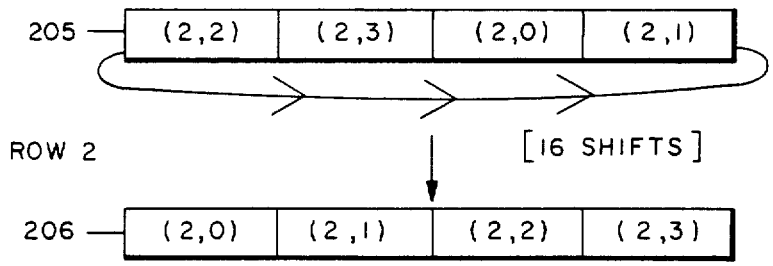
FIG_2C
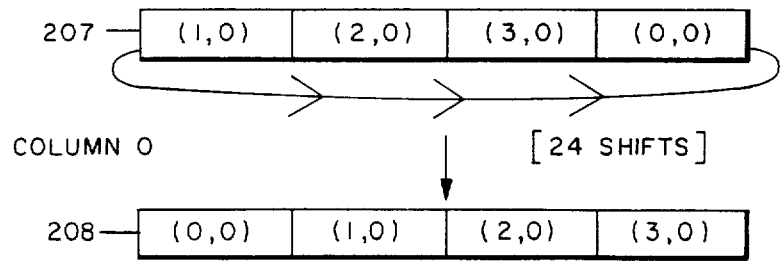
FIG_2D

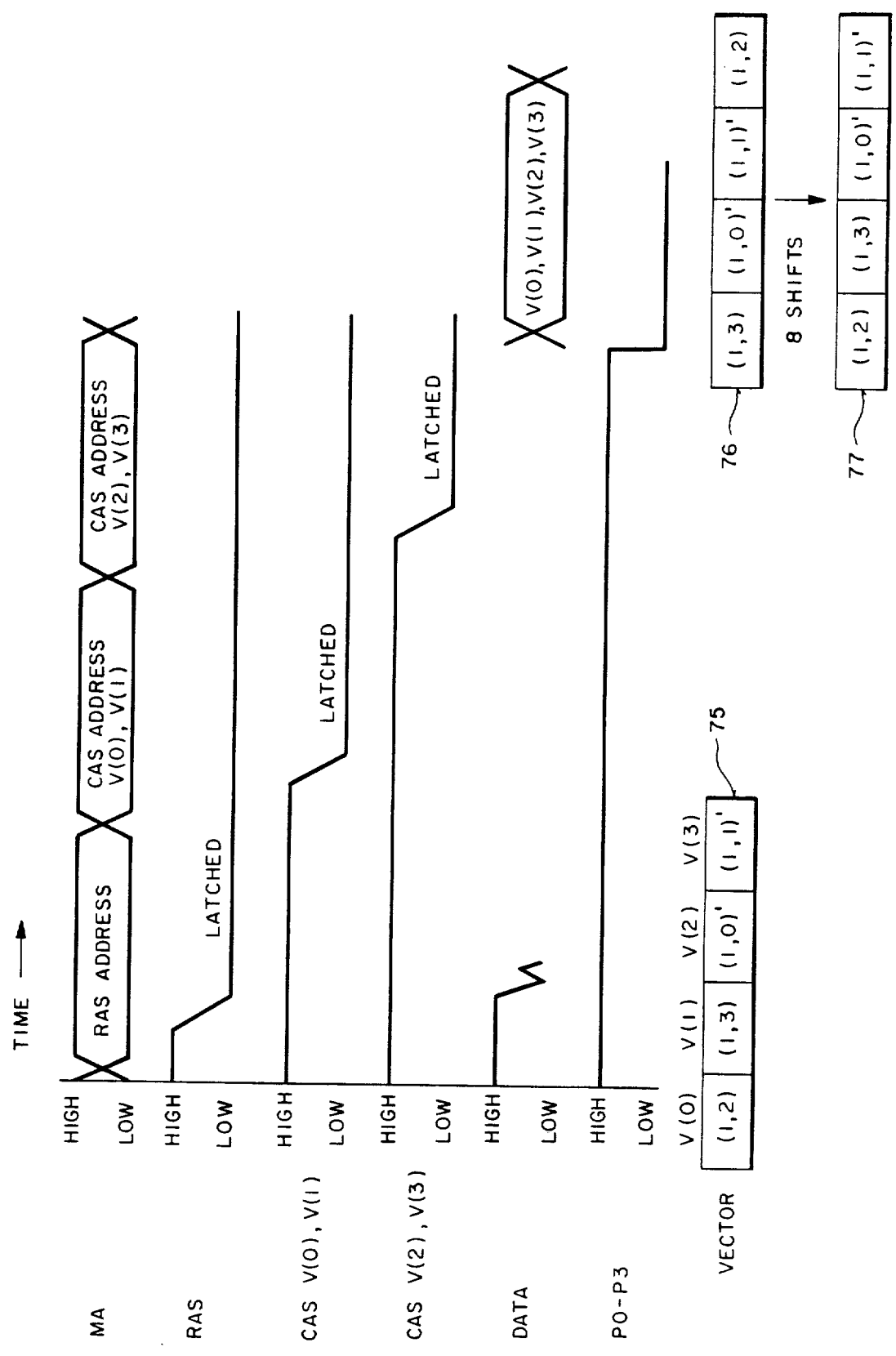
FIG_3

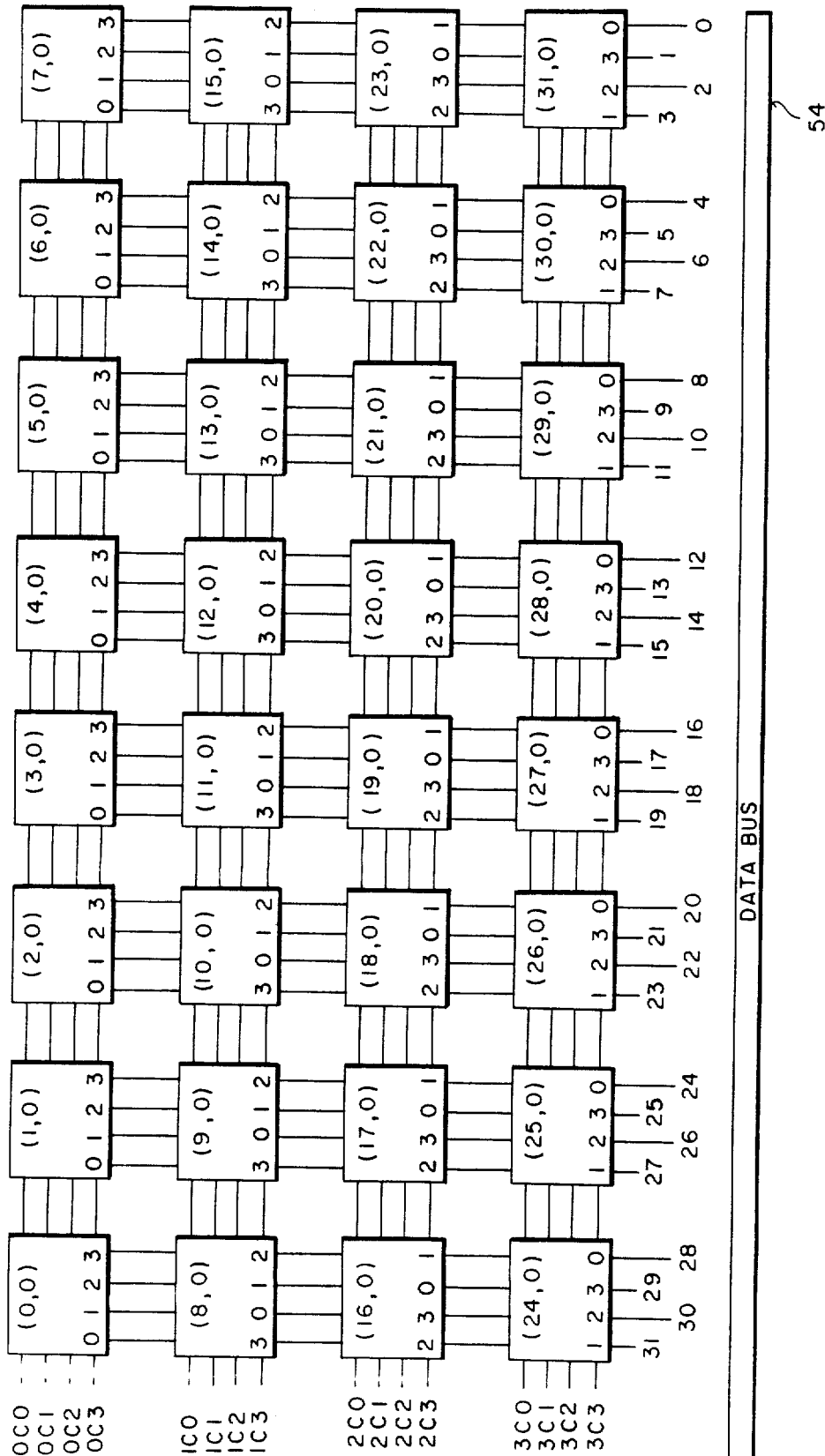
FIG._4A

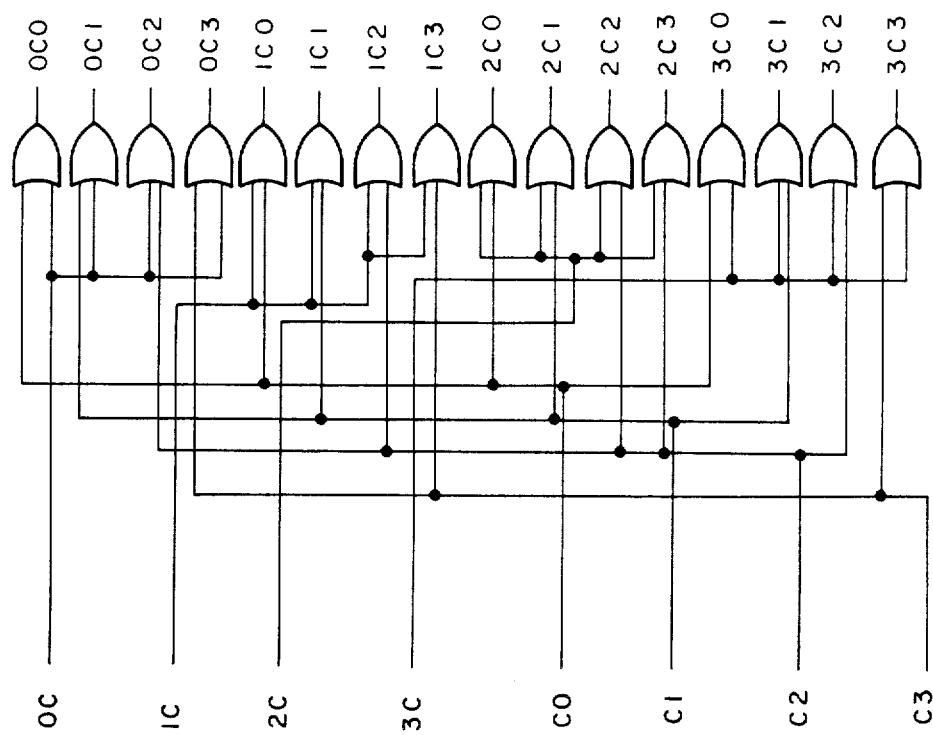
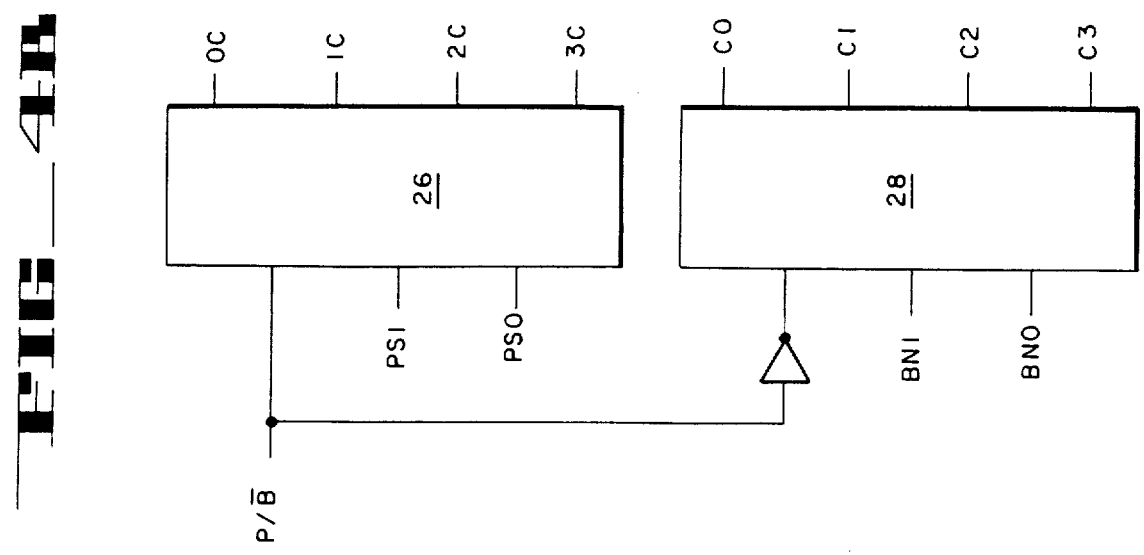
FIG. 4B

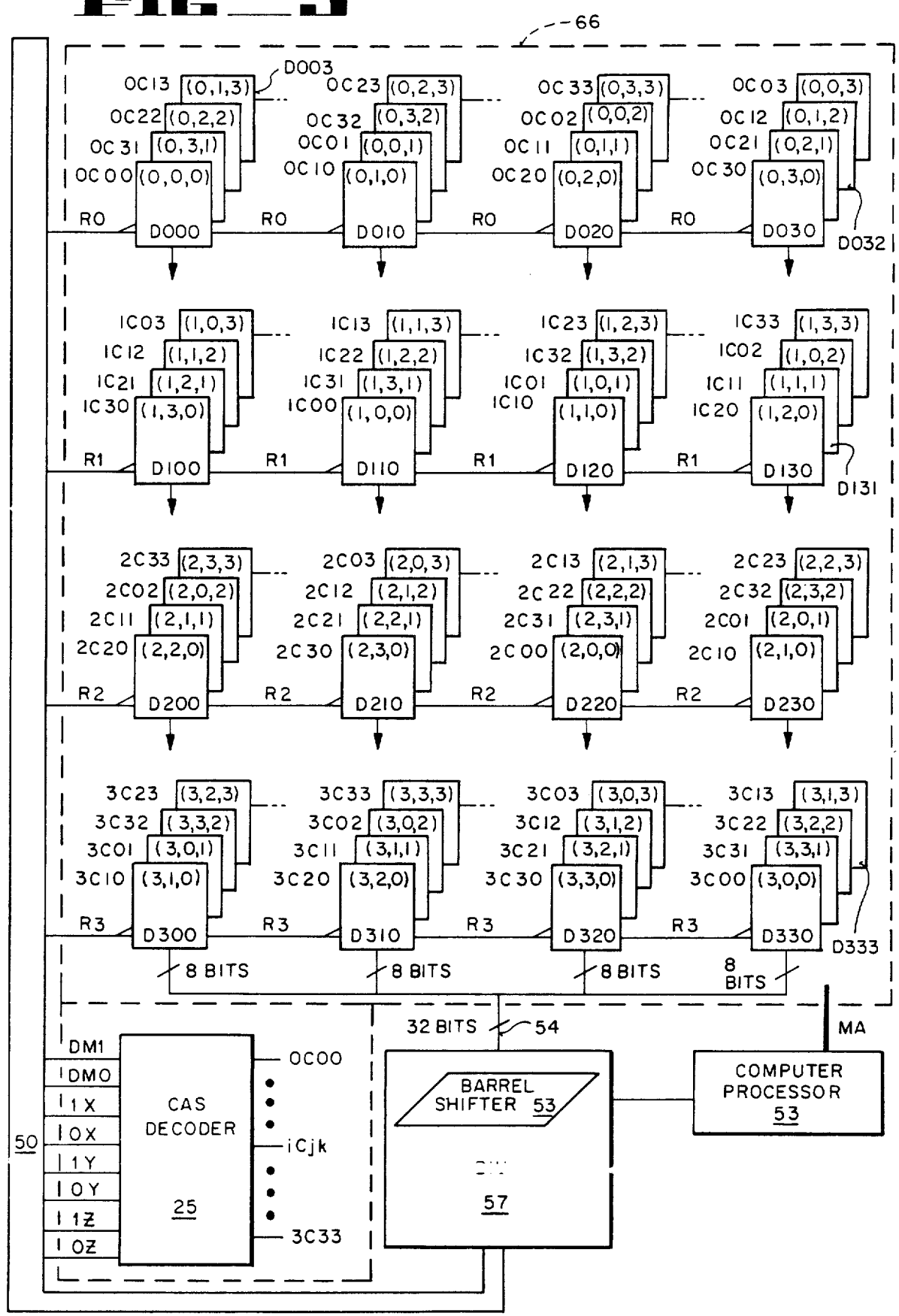
FIG_5

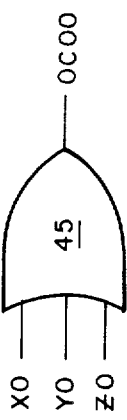
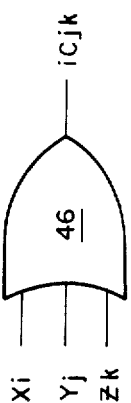
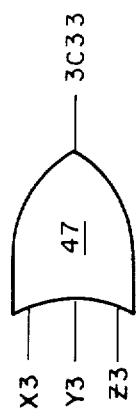
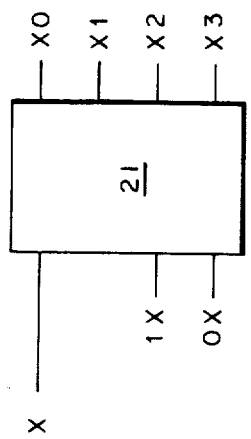
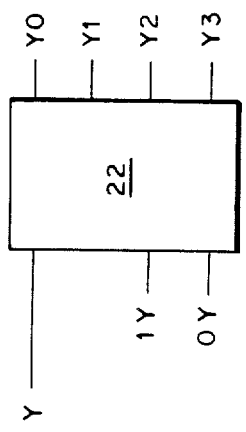
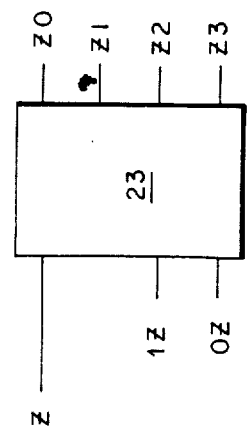
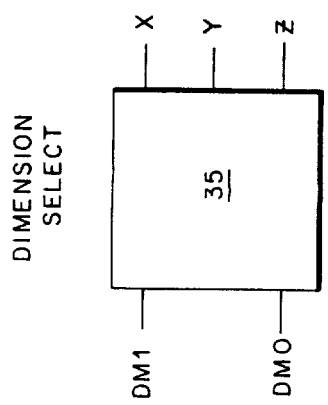
FIG_6

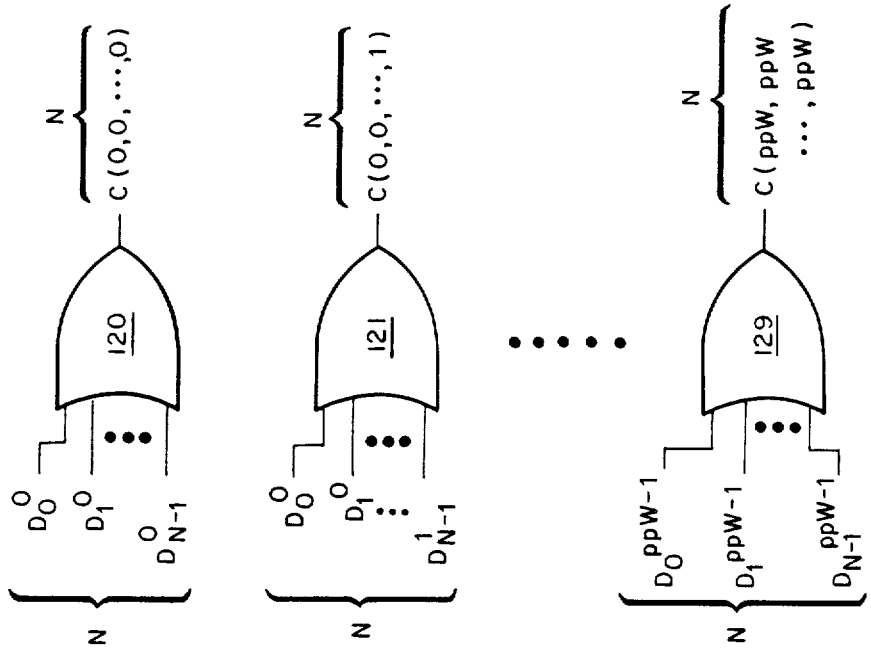
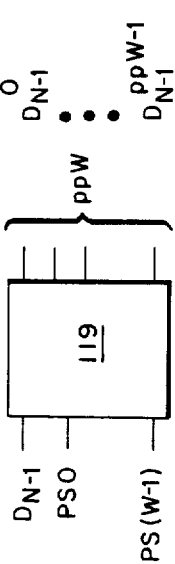
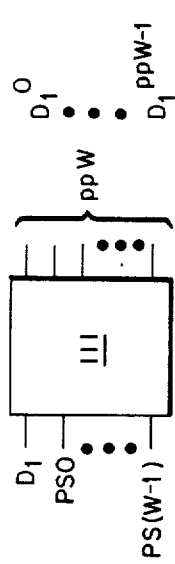
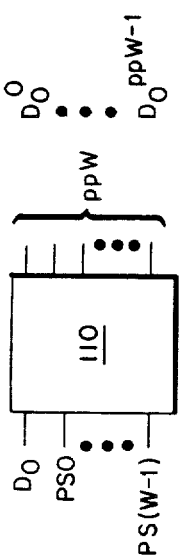
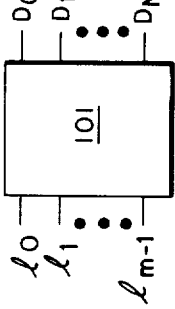
FIG. 7

VECTOR SELECTABLE COORDINATE-ADDRESSABLE DRAM ARRAY

BACKGROUND OF THE INVENTION

1. Field of the Invention.

The field of the invention is that of bus architectures for electronic digital information storage, comprising an addressing and retrieval apparatus thereof. Specifically, the present invention is a bus architecture for an array of memory devices.

2. Prior Art.

Computer memories are typically addressed in a linear addressing mode. In linear addressing each memory element is referred to by a unique number. This is sometimes referred to as a linear array. Each memory address typically referenced some n number of bits-originally n being 8 bits or 1 byte, later 16-bits or one word, or even 32-bits which is referred to as a word or a long word. A bus connects the memories with a processor. The processor accesses memory by supplying an address to a bus controller, which fetches the desired data.

For graphics applications, a variation is made upon the linear array. This variation is often referred to as bit mapped graphics. Each atomic position in the graphical display is called a "pixel," and each pixel has a unique address. A piece of pixel data can be any length ranging from one bit to sixteen bits to any finite number. A one bit pixel typically indicates light or dark on the display. A three or four bit pixel typically represents a color for the corresponding position on the display.

In bit map graphics the addressing space is referred to by row and column indexes. A typical CRT display is a 640 pixel by 400 pixel array, with a black and white pixel being represented as one bit and a color pixel as three bits. Under these methods the individual memory locations are referenced by their position on the X Y coordinate grid. However, the implementation of the (X, Y) coordinate is a simple linear combination to produce the actual linear address. By being constrained to such linear addressing modes, many graphical operations proved to be quite time consuming and difficult.

For example, reading row or column vectors is a common graphical operation. It is often the case that multiple accesses are needed as well as complicated sorting algorithms after the fetching of the data. With a 640×400 array of bytes where one byte equals one pixel, a 32-bit bus accesses a vector comprising four contiguous bytes in one fetch. Depending on the organization of the arrays that either allowed for quick retrieval of a 4 byte row or column vector. However, it would take four fetches to obtain a 4 byte vector of the other dimension, as well as extra calculation to determine the physical addresses.

With a 640×400 pixel array, there are 256,000 pixels that must be updated in 0.1 seconds or less. It is expedient to modify as many pixels as possible in one bus cycle. In fact, with a typical 480 ns bus cycle time it is not possible to modify that many pixels in 0.1 seconds if one pixel at a time. Therefore, as many pixels as can fit on a bus cycle are typically character display processed at once.

Regardless of the streamlining and optimization involved, in order to get one bus vector of data it is still necessary for multiple fetches in the case of nonaligned data. For example, if a computer with a 16-bit bus addressed its memory on 16-bit boundary lines but had 8-bit pixels, two fetches are required to retrieve a two pixel vector that lay across boundary lines. That is, the first pixel is the least significant byte of the lower address and the second pixel is the most significant byte of the higher address. The first fetch retrieves one address and stores the relevant pixel, then the second fetch retrieves the other address and stores the relevant pixel.

The prior art methods of addressing generally are limited to horizontal vectors and none took optimum advantage of the fast pagemode of DRAMs. With only horizontal vectors being accessible, a multiple number of accesses are needed to produce column vectors along with much complicated processing of the information retrieved thereof.

In graphics processing it is common to process small rectangular areas, since these correspond to characters. However, where there are non-aligned boundaries of the rectangular areas and the size of the rectangles does not fit exactly with the linear address arrays, then problems are further compounded. The multiple fetches necessary, to access a vertical vector, are multiplied by the additional dimension of the region.

An example of a Prior Art DRAM Array is described in U.S. Pat. No. 4,038,646, which is assigned to the assignee of the present invention.

What is lacking is a device that could take advantage of the properties of DRAMs which consist of the ability for fast access along columns as well as rows. One object of the present invention is to provide for a device which can fully utilize the efficient properties of CMOS DRAMs and other such logical memory devices. Another object of the invention is to provide for higher dimensional arrays which will allow for access of vectors along any dimension with equal ease.

SUMMARY OF THE INVENTION

The present invention is a bus control and memory array architecture. Individual data elements are addressed physically by coordinates. In the two dimensional array embodiment, both rows and columns of the array are equally accessible. That is, a word of data is accessible in one bus cycle for properly aligned vectors. For vectors that cross word boundaries, methods are used to achieve substantially the same result by utilizing the multiplexed address latching capabilities of DRAM's.

The present invention is particularly well suited for graphics applications. Each data element, which is called a pixel, is the smallest indivisible section of a picture. The ability to rapidly process pixel vectors is necessary in many of today's video displays. Another aspect of the present invention is a bit plane generation device. A bit plane, in the context of graphics, is an array of bits that comprises only a portion of the individual pixel. For example, the background color is a common pixel element. A variation of the present invention can generate a bit plane representation of a graphic image, so that only a specified bit of the several bits in each pixel can be examined or manipulated.

The present invention can also be used for higher dimensional arrays. A three dimensional array architecture is described that allows for access along X, Y, or Z vectors with equal ease. The present invention can be generalized for any n-dimensional array.

BRIEF DESCRIPTION OF THE DRAWINGS

FIG. 1 is a schematic diagram of a memory cell of a preferred embodiment of the present invention.

FIG. 2a, 2b, 2c, and 2d are examples of bit positions and their translations.

FIG. 3 is a timing diagram of non-aligned horizontal vector retrieval with an improvement to the preferred embodiment of FIG. 1.

FIG. 4a is a schematic diagram of a memory device in the preferred embodiment using the bit plane packed pixel architecture.

FIG. 4b is a circuit diagram of the CAS control for the device of FIG. 4a.

FIG. 5 is a schematic diagram of a three dimensional memory cell of the present invention.

FIG. 6 is a circuit diagram of the enabling logic of the three dimensional memory cell of FIG. 5.

FIG. 7 is a circuit diagram of the CAS control for an n-dimensional array of the present invention.

DETAILED DESCRIPTION OF THE PRESENT INVENTION

While the invention is herein described in terms of a preferred embodiment, it will be understood by those skilled in the art that numerous variations in form and detail may be made within the teachings of the present disclosure. In other instances, well-known structures are not shown in detail in order not to unnecessarily obscure the present invention. Accordingly, it is to be understood that the terminology used is for the purpose of illustration rather than limitation.

One of the biggest limitations on the speed at which computers operate is the rate data can be accessed in memory. The present invention discloses techniques of accelerating access to data organized in coordinate-addressable arrays, of arbitrary dimensions, stored in DRAM arrays. Past solutions on the memory access problem have centered on either adding more buses, widening the buses, or providing a special fast local access mode called pipelining. Adding and widening buses have the limitations of increased cost and power and reduced reliability. Widening the buses the additonal disadvantage of inefficiency if the bus is significantly wider than data items commonly accessed.

The present invention allows widening data buses while reducing bus usage inefficiency for applications which use the bus for coordinate addressable arrays of regular-sized data elements. Many applications organize data in this fashion. Among them are computer graphics, numeric processing, simulation, machine control, and image processing. This invention describes some tools the computer designer can provide the applications programmer so that his program can access commonly used groupings of array data elements more quickly and efficiently over computer data buses.

Applications often require groups of data elements from the array simultaneously rather than single data items. These groups may be in the form of subarrays, vectors or data fields (such as a bit plane) distributed throughout the array. The present invention presents several methods of organizing a physical array of dynamic RAMs so that existing methods of accelerating access to computer memory will work more efficiently for a given application.

A programmer accesses data element vectors by specifying both the dimension desired and the coordinate of the first element of the vector. For example, an instruction to load a vector would have the form: Load the dimension A vector starting at coordinate B. Similarly, an instruction to store a vector would have the form: Store the dimension A vector starting at coordinate B. Alternately, a mode register could be used to specify the dimension A. With the mode register, a load or store instruction would only need to specify coordinate B. It would be the responsibility of the programmer to determine whether the mode register is properly set to the correct dimension.

In this fashion, a program can use a plurality of different DRAM arrays for different uses. Each use, such as computer display, image scanning, mathematical matrix manipulation, or image modeling to mention only a sample of possible uses, benefits from the improved performance of the present invention's memory arrays.

The present invention maps a logical array of pixels onto a physical array so as to maximize the efficiency of retrieving both rows, or X-vectors, and columns, or Y-vectors from the logical array. The present invention maps an array of data elements, a subset of the total array, onto a single memory cell. The dimensions of the memory cell are determined by both the data element size and the data bus size. The dimensions of the array are equal to the truncated integral value of the data bus size divided by the data element size. Thus, if the data element size is three bits and the data bus size is sixteen bits, the dimensions would be no greater than 5×5.

In the preferred embodiment the logic array consists of pixel elements of 8 bits in length addressable on a 32-bit data bus. The data bus can be any size, and the size defines the size of a word of data, so in the preferred embodiment each word is 32 bits. This provides for each memory cell to be a 4×4 array of pixels. The physical arrangement of the array allows for simultaneous access for a horizontal or vertical vector in the array. Furthermore, fast pagemode and normal pagemode of DRAMs provide the effect of two dimensional rectangular pixel arrays to be accessed by multiple sequential vertical vectors. For vectors that are not contained in one memory cell, vectors which cross boundaries, the preferred embodiment allows for equal access to cross boundary vertical vectors as well as horizontal or vertical vectors in the array. A variation on the invention also allows for equal access of horizontal cross boundary vectors, in addition to cross boundary vertical vectors and both vertical and horizontal vectors in the array.

In a conventional computer memory, locations are addresses by a single number, a linear address. The present invention employs a coordinate addressing system. Each coordinate address refers to one pixel and comprises of a sequence of bits for each dimension of the array. In the preferred embodiment, a two dimensional array is addressed by a word which comprises two sixteen bit addresses, one for the X-coordinate or row address and one for the Y-coordinate or column address. A Bus Interface Unit (or BIU) interprets the least significant bits of the address, which involves activating RAS (R) and CAS (C) lines, sending out PS1 and PS0 signals, generating a multiplex address, and instructing a barrel shifter. Each memory cell, which contains 16 pixels, has a unique address. The memory cells are referenced over a Multiplexed Address line MA.

FIG. 1 shows a cell 65 of a DRAM array of the preferred embodiment of the invention. The cell 65 is coupled by a bus 50 to BIU 57, which is coupled with a computer processor 55. Each pixel storage device D00-D33, shown in FIG. 1, is coupled with RAS lines R0-R3, CAS lines C0-C3, multiplexed address line MA, and has a TR/G pin (not shown) coupled to one of Pixel Select lines P0–P3. In order for a pixel storage device to send its information to an data bus 54, all three of the Px, Cx and Rx lines of the individual memory device must be activated and the cell's address must be present on multiplexed address line MA. Rx, Cx, and Px activation is by a low signal in the preferred embodiment.

Also attached to every storage device is MUX line 58 which couples them to MUX 51. MUX 51 outputs selected portions of the 64 bits (4 bits from each device) that appear each period. MUX Video Control 52 instructs the MUX to send 8 bits to serial port (SP) 62 each period. These elements are typical of Video Random Access Memory or VRAMs. The MUX line 58, MUX 51, MUX Video Control 52, and SP 62 are not necessary to practice the present invention, but serve as an example of a use of the present invention.

The command control elements of the present invention are contained in BIU 57 and Computer Processor 55. BIU 57 contains Barrel Shifter 53 and is coupled with computer Computer Processor 55 by three lines. Data Bus 54 couples BIU 57 and Computer Processor 55 by either sending retrieved data from Barrel Shifter 53, after being properly aligned, to the Computer Processor 55 or sending data to be stored from Computer Processor 55 to Barrel Shifter 53, to be properly aligned for storage. Coordinated line 61 couples the two elements to send the coordinate of the row or column selected from Computer Processor 55 to BIU 57. A line 63 is used to send the R/$\overline{C}$ signal from Computer Processor 55 to BIU 57.

BIU 57 is coupled to the array cells by bus 50, which carries the RAS, CAS R/$\overline{C}$, PS1 and PS0 signals to the array cells. Computer Processor 55 is coupled to every memory device in every cell by the multiplexed address line MA (the individual lines to each cell are not shown in FIG. 1).

The memory devices D00–D33 are a type of DRAM. There are three different types of DRAMs that require some alternate architectures and/or methods. The preferred embodiment uses Tristate Bidirectional DRAMs with non-latched CAS address, of the ×4 (4 bit) and ×8 (8 bit) variety. The present invention can also be practiced with common ×1 (1 bit) DRAMs. An improvement on the preferred embodiment utilizes Tristate Bidirectional DRAMs with a latched CAS address, of the ×4 and ×8 variety. Other memory devices can be used with the present invention, these particular DRAMs are listed for purposes of demonstrating the adaptability of the invention to different types of memory.

The Tristate Bidirectional DRAM with non-latched CAS address has six interface connections. One is a series of 4 or 8 data I/O pins for either input or output of data coupled to data bus 54, the number depending on whether the DRAM is ×4 or ×8. Two more R and C pins are coupled to RAS and CAS lines, with only the R pin latching the RAS Address. Another segment of pins is that which accepts the multiplexed address, or MA, from line 58. The TR/G pin is an enable pin coupled to one of pixel select lines P0–P3. Finally, there is a WE or write enable pin which is not shown. In order to read from the DRAM, its R, C, and TR/G pins must be activated and the DRAM's address must be present on MA. Then the data stored in the DRAM is sent on the I/O lines to data bus 54. In order to write to the DRAM, the WE pin must be activated in addition to the R, C, and TR/G pins, and the DRAM's address must be present on MA.

The Tristate Bidirectional DRAM with latched CAS address has the same configuration as that with non-latched CAS address. The difference lies with the DRAM latching on the MA upon activation of the C pin. In this manner, after the C pin latches the CAS address of a particular DRAM, the MA may change to latch another DRAM location upon activating its C pin. This is explained in greater detail below with the discussion of FIG. 3.

The common ×1 DRAM requires additional logic to be utilized in the preferred embodiment. Like the ×4 and ×8 Bidirectional DRAMs, the common ×1 DRAM has the MA, R, C, and WE connections. However, there are separate data input and separate data output pins, and there is no TR/G pin. In order to read, the R and C pins, coupled to the RAS and CAS lines, must be active and the DRAM's address must be present on MA. In that case, one bit of data is sent on the data output line which is coupled to data bus 54. In order to write, all the R, C, and MA must be as above and the WE active, so the bit present on the data input pin (not shown) is stored in the DRAM. Because of the absence of the TR/G pin, the Px line cannot be directly connected to the ×1 DRAM. The DRAM's CAS line and its Px are coupled in an OR gate 95 (because activation is a low signal in this device) and connect the result of the OR gate 95 to the C pin. This will accomplish the same results as the internal logic of the Bidirectional DRAMs, although it does require additional external circuitry.

Activation consists of proper timing in conjunction with the proper signal lines. The decoder 24 activates the proper Px line of the cell in accordance with the row or column selector signal R/$\overline{C}$ and the two least significant digits of the address, which appear on lines PS1 and PS0. The Px lines are attached to the TR/G pins of cell's memory devices. The Rx and Cx lines are activated. When the R pin of the preferred embodiment's DRAM is activated, the multiplex RAS address is latched in. To access a particular X-vector or row, Row i, P0–P3 are set in conjunction with Ri and Ci. To activate a particular Y-vector or column, Column j, R0–R3 and C0–C3 are set in conjunction with Pj.

The individual RAS and CAS lines are activated by the bus interface unit 57. The Pixel Select lines are activated by a decoder 24, which is a 2 to 4 decoder. When R/$\overline{C}$ is low, then only one of the P0–P3 Pixel Select lines is activated. The particular line is determined by PS0 and PS1, the two bits of lowest significance in the coordinate address. When R/$\overline{C}$ is high then all of P0–P3 are activated.

When Y-vectors or columns lie across cell boundaries then an extra time period is needed to access the vector. The RAS lines are activated separately so as to latch in different cell addresses at each Rx line activation. Then the beginning CAS lines are activated to send the Y-vector of pixels on the data bus. Then the cell address is changed to the next lower cell by S between the RAS line activations. S represents the width of the array, the number of columns in the array which is usually a multiple of the CAS address size. In the case of columns, only the Rx and Cx lines necessary to activate the portion of the column needed are set as the clear signal on the R/$\overline{C}$ line would activate only one of P0–P3.

When X-vectors or rows lie across cell boundaries two bus cycles are required. This is because the cells on either side of the boundary share the same RAS lines. All the TR/G pins would be activated because the R/C̄ signal would be set. Only the RAS line R0–R3 of the row desired would be activated to only allow one address on the multiplex address. In the case of rows, there is no method of selectively activating individual pixels in the preferred embodiment.

After activation, the data is sent on data bus line 54. The data is received in one bus cycle, in the case of one word of aligned data or a non-aligned row. Two cycles are required for one word of non-aligned row data. Once the data has been delivered over the data bus 54, the control mechanism 52 instructs a barrel shifter 50 to properly align the data. The barrel shifter 53 is a device commonly known in the art, and is a typical element of BIU 57. The barrel shifter 53 can, in one operation, shift a word of data by n positions, with n ranging from 0 to the word size.

FIGS. 2a–2d show the alignment process. Each Figure has an initial result of a fetch from memory, words 201, 203, 205, and 207 for FIGS. 2a, 2b, 2c, and 2d respectively. After shifting, the data is shown in its proper logical alignment, words 202, 204, 206, and 208 for FIGS. 2a, 2b, 2c, and 2d respectively.

FIG. 2a shows the results of accessing one word of aligned data. Here, no shifting is needed as the data enters in its proper order. This is an access to a Row 0 in a memory cell in the preferred embodiment of the invention. An access to a Column 3 would have a similar alignment of, in this order, (0,3), (1,3), (2,3), and (3,3).

FIG. 2b shows the results of accessing a Column 2 vector in a memory cell of the preferred embodiment. Here, the eight least significant digits are in the most significant positions. The control mechanism 52 instructs the barrel shifter 53 to shift the 32-bit word by eight bits. This properly aligns the bits to form the desired vector. An access to a Row 1 would have a similar alignment of, in this order, (1,3), (1,0), (1,1), and (1,2).

FIG. 2c shows accessing a Row 2 vector in a memory cell of the preferred embodiment. Here, the sixteen least significant digits are in the most significant positions. The control mechanism 52 instructs the barrel shifter 53 to shift the 32-bit word by sixteen bits. This properly aligns the bits to form the desired vector. An access to a Column 1 would have a similar alignment of, in this order, (2,1), (3,1), (0,1), and (1,1).

FIG. 2d shows the results of accessing a Column 0 vector in a memory cell of the preferred embodiment. Here, the eight most significant bits are in the least significant positions. The control mechanism 52 instructs the barrel shifter 53 to shift the 32-bit word by twenty-four bits. This properly aligns the bits to form the desired vector. An access to a Row 3 would have a similar alignment of, in this order, (3,1), (3,2), (3,3), and (3,0).

The number of shifts required to properly align a row or column can be derived from the following equation:

Y-Vector # shifts = ((X coordinate) modulus ppW) * bpp

X-vector # shifts = ((Y coordinate) modulus ppW) * bpp where ppW is pixels per word, here 4, and bpp is bits per pixel, here 8.

The present invention allows access to a full row or column of the cell on a common bus. Prior Art devices allowed access to either a full row or column but not both. To get the other dimension, multiple accesses were necessary. The present invention uses a novel mapping of logical arrays to physical structures. Table 1 shows a conventional arrangement of a 4×4 array. Each logical row, column position is located in the corresponding physical location. Table 2 shows the arrangement of the present invention. The logical and physical row, column arrangement has no direct correspondence. In Table 1, every logical row member is in a separate physical column. However, every logical column member is in the same physical column. In Table 2, every logical row member is in a separate physical column, and every logical column member is in a separate physical column. Each logical row member remains in its physical row. The physical column each logical coordinate of the row must be mapped to can be determined by the following equation:

Physical Column = (Logical Column + Logical Row) modulus Array Size where the Array Size is in terms of column width.

With each physical column allowing only one pixel to be sent effectively each clock cycle, only the organization shown in Table 2 can access an entire logical column simultaneously. Although the results of the access will be out of order in three of the four cases by the use of a barrel shifter the results can be properly arranged. Using a barrel shifter 53 is much quicker than having additional accesses. Thus, the average time required to fetch a vector is much less with the present invention than with a conventional arrangement

TABLE 1

Conventional Arrangement of a 4 × 4 Array

| Logical row/column | 0 | 1 | 2 | 3 |
|---|---|---|---|---|
| 0 | (0,0) | (0,1) | (0,2) | (0,3) |
| 1 | (1,0) | (1,1) | (1,2) | (1,3) |
| 2 | (2,0) | (2,1) | (2,2) | (2,3) |
| 3 | (3,0) | (3,1) | (3,2) | (3,3) |

TABLE 2

Present Invention's Mapping of Logical Pixel Location to Physical Rows and Columns of a 4 × 4 Array

| Physical row/column | 0 | 1 | 2 | 3 |
|---|---|---|---|---|
| 0 | (0,0) | (0,1) | (0,2) | (0,3) |
| 1 | (1,3) | (1,0) | (1,1) | (1,2) |
| 2 | (2,2) | (2,3) | (2,0) | (2,1) |
| 3 | (3,1) | (3,2) | (3,3) | (3,0) |

In the preferred embodiment, the first segment of DRAMs stores a 1023×1023 bit matrix. The first RAS address boundary contains the section defined by (0,0) to (1023,255). The second RAS address boundary contains the section defined by (0,256) to (1023,511). The third RAS address boundary contains the section defined by (0,512) to (1023,767). The fourth RAS address boundary contains the section defined by (0,768) to (1023,1023).

For a fixed RAS address, within the RAS address boundaries the DRAMs can be accessed using page-mode or fast pagemode addressing. By this manner half of the coordinate address is set by the RAS lines so rectangular sections of the array can be quickly fetched by strobing the appropriate CAS lines. The maximum size of the rectangular sections has the dimensions of the number of data elements per bus width, by the value of the number 2 raised to the power of the number of bits in the CAS address multiplied by the number of data elements per bus width.

FIG. 1 shows the memory cell of the preferred embodiment of the present invention. Table 2 shows FIG. 1's logical to physical positional mapping. Here are some examples of retrieving various aligned and non-aligned vectors:

EXAMPLE 1

In order to fetch Row 1 of a particular address, the following must be done. First the address itself is activated. The current cell address is carried on the multiplexed address bus 54. The decoder 24 accepts the R/$\overline{C}$ signal, which is set. The decoder 24 activates all the cell's TR/G pins by activating P0-P3. R1 and C1 are activated by BIU 57 to cause bus 50 to carry the vector comprising, in this order, pixels (1,3), (1,0), (1,1), and (1,2). The bus 50 is connected with a barrel shifter which quickly shifts the bits around to form the proper vector.

EXAMPLE 2

This example demonstrates the fetch of Column 2 of a particular address. The current cell address is carried on the multiplex address 54. The cell's decoder 24 receives the column signal on R/$\overline{C}$, as well as a 1 on PS1 and a 0 on PS0. P2 is activated and the remaining P0, P1 and P3 pins are deactivated. All the R0-R3 signals and C0-C3 signals are activated by BIU 57 to cause bus 50 to carry the vector comprising, in this order, pixels (2,2), (3,2), (0,2), and (1,2). This grouping of bits is shifted to form the proper order.

EXAMPLE 3

This example deals with a Y-vector or column that begins at logical position (1,3) and crosses the boundary to the next cell in the column, ending at logical position (0,3). The beginning address is carried on the multiplex address bus 54. The decoder 24 receives the R/$\overline{C}$ signal as the column signal, PS1 is 1, and PS0 is 1. This indicates that the column vector is that of row $11_{binary}$, or 3. Thus, P3 is activated. The address of the beginning memory cell in on multiplex address 58. R1-R3 and C1-C3 are activated by BIU 57 so that pixels (1,3), (2,3), and (3,3) are sent on the bus in positions 0-23. During the same bus cycle the beginning address increased by S is addressed. This address is present during the next time period on multiplex address 58. That decoder 24 receives the R/$\overline{C}$ signal as the column signal, PS1 is 1, and PS0 is 1. This indicates, in the next time period, that the column vector is that of $11_{binary}$, or 3. Thus, P3 is set. R0 and C0 are activated by BIU 57 so that pixel (0,3) is sent on the bus 50 in positions 24-31. At the end of the second period, all positions 31-0 of the bus are sent to the barrel shifter 53, that properly arranges the digits.

EXAMPLE 4

This example deals with an X-vector or row that begins at logical position (1,2) and crosses the boundary to the next cell in the row, ending at logical position (1,1). The beginning address is carried on multiplex address 54. The decoder 24 receives the R/$\overline{C}$ signal as active, PS1 is 1, and PS0 is 0. This indicates a row vector, thus, P0-P3 are activated. R2 and C2 are activated by BIU 57 so that pixel (1,2) is sent on the bus 50 in positions 31-24 and pixel (1,3) is sent on the bus 50 in positions 7-0. The results are shifted, and these two pixels are saved. The beginning address increased by one is activated. The decoder device 24 receives the R/$\overline{C}$ signal as active, so all P0-13 pins are activated. R2 and C2 are activated by BIU 57 so that pixels (1,0) and (1,1) are sent on the bus 50 in positions 23-8. At the end of the second cycle, the results of the second fetch are on the bus and are sent to the barrel shifter 53, that properly arranges the data. The two pixels of the second fetch are then saved. The two pixels from the first fetch are the first two pixels of the desired vector, and the two pixels from the second fetch are the last two pixels of the desired vector. Combining all four pixels in the proper order forms the desired vector.

A modification to the preferred embodiment that allows for a single bus fetch of non-aligned horizontal data. Such a fetch is shown in FIG. 3. FIG. 3 is a timing diagram of the fetch of Example 4 using this modification. Vector 75 is the desired piece of data. Vector 76 is the vector generated on the DATA line when P0-P3 are activated (set low). Vector 77 is the result of shifting vector 76. The MA line shows different addresses as time progresses, allowing the RAS and CAS lines to latch. The RAS line is common to all elements of the devices storing vector 75 and need only be activated (and latched) once. The C pins of the devices storing v(0) and v(1) are latched by activating the CAS lines coupled with those devises while the MA has the cell containing v(0)'s and V(1)'s CAS Address present. Later, the C pins of the devices storing v(2) and v(3) are latched by activating the CAS lines coupled with those devices while the MA has the cell containing v(2)'s and v(3)'s CAS Address present. When lines P0-P3 are activated (set low), the latched storage devices are enabled and the vector 76 is sent on the DATA bus.

This modification requires using Tristate Bidriectional DRAMs with latched CAS address or the functional equivalent. Using the same fetch of Example 4, the improvement can select desired vector 75.

Vector 75, or v, consists of logical positions v(0)=(1,2) and v(1)=(1,3) in one cell, and in the contiguous column to the right of logical positions v(2)=(1,0)' and v(3)=(1,1)'. In the preferred embodiment, only one multiplex address could be used with the CAS signals per bus cycle. Thus v(0) and v(1) could not be activated during the same bus cycle as v(2) and v(3). But using latched CAS addressing with proper timing of signals, access during the same bus cycle is possible.

The activation of the RAS line common to the entire vector is the first step. First the RAS address is present on the multiplex address, and the RAS line is activated to latch the RAS address. This activates the R1 pins of the entire row.

The second step is the activation of the CAS line of the first two pixels of the vector. First the CAS address of the v(0) and v(1) memory devices is present on the multiplex address, and the CAS line is activated to latch the CAS address of v(0) and v(1). This activates the C1 pins of the DRAMs containing v(0) and v(1).

The third step is the activation of the CAS line of the last two pixels of the vector. First the CAS address of v(2) and v(3) memory devices is present on the multiplex address, and the CAS line is activated to latch the CAS address of v(2) and v(3). This activates the C1 pins of the DRAMs containing v(2) and v(3).

At this point all the P0-P3 lines go low, activating the DRAMs containing v(0)-v(3). The desired data is then on the data bus, which will require an 8-bit shift to become properly aligned. With the improvement, this fetch takes approximately the same amount of time as that of Example 3, as both examples are accomplished during one bus cycle.

BIT PLANE/PACKED PIXEL SELECTABILITY

Another configuration of the present invention provides for the ability to generate bit plane projections of a pixel array. A bit plane is a selection of one particular bit of each pixel. For example, in a color display pixel, bit 7 of an 8-bit pixel might contain information on the presence of green in the pixel. It is useful to be able to reference only one bit, the green element of each pixel, making a bit plane map of the green elements of the display.

The adaption of the present invention to generating a bit plane is as follows. The logical Y coordinate is the same for every position in the array. This is because the conventional ordering of a bit map is for every element of the first row of pixels to appear consecutively in order in the first row of the bit map. However, the pixels are arranged so that entire pixels can be sent on the data bus. To send only fractions would waste bus space and require much more time sorting and presenting the bit map. In terms of bit map access, it is optimal to arrange the pixels of the logical rows consecutively in the physical columns. That arrangement unfortunately does not allow for easy access to pixel vectors. But by arranging the logical positions consecutively in the physical array, then using a more complicated shifting Algorithm both easy pixel vector and bit plane access is attainable.

For either approach to be successful, the bits of each pixel must be rearranged. In each column, because columns share positions on the data bus, the logical bits to comprise the bit plane must be aligned on different physical columns. For the green element example, using FIG. 1, the green element in D00 would be in positions 6 and 7, in D10 the positions 0 and 1, in D20 the positions 2 and 3, and in D30 positions 4 and 5.

Modifications must also be made to the barrel shifter and the activating mechanisms. But with the proper modifications, selectable bit plane accessibility is compatible with the arbitrary axis-aligned vector addressability. It is possible to combine bit plane accessibility with packed pixel vector access in every dimension. In fact, many different features such as the bit plane accessibility, the packed pixel feature, the row and column equal access, and the non-aligned data accessibility can be used in different combinations. However, many combinations have performance limitations and/or hardware restrictions. Therefore, only a simple bit plane/-packed pixel combination will be shown in detail.

FIG. 4a shows an architecture of a 4×8 array having a combined selectable bit plane packed pixel architecture. There are 32 memory devices numbered (0,0) to (31,0). Each device comprises four×1 DRAMs, to store four bit pixels. The RAS lines are not shown, but the row of devices (0,0) to (7,0) have R pins coupled to R0, the row of devices (8,0) to (15,0) have R pins coupled to R1, the row of devices (16,0) to (23,0) have R pins coupled to R2, and the row of devices (24,0) to (31,0) have R pins coupled to R3. The CAS lines iCj of FIG. 4a are produced by the CAS line enabling circuitry shown in FIG. 4b. In FIG. 4b, the iCj lines are a product of OR gates 95, which are coupled to lines iC from decoder 26 and Cj from decoder 28. Decoder 26 receives a P/B̄ signal which specifies either a bit plane access, where all iC are activated (low), or a packed pixel access, where only the vector addressed by the two least significant digits provided by PS1 and PS0 are activated. Decoder 28 receives a P/B̄ signal and activates all Cj when there is a packed pixel access, but only activates the Cj line specified by the bit number specified by the NB1 and BN0 lines. Table 3 shows the truth table from decoder 26 and Table 4 shows the truth table from decoder 28. The signal values 1 are for high, 0 for low, and "-" for any signal in Tables 3, 4, and 5. The CAS lines iCj are set according to the equation:

$$iC \lor Cj \; iCj$$

Where "V" is logical OR and " " is the assignment operator.

Each C pin of logical pixel position (0,0) to (7,0) is coupled to CAS line 0Cj, similarly for the other rows. There are data lines 0–31 which are coupled both to the DRAM memory devices and data bus 54. On each data line 0–31 no two logical bit positions share the same physical data line.

TABLE 3

| | | Decoder 26 | | | | |
|---|---|---|---|---|---|---|
| P/B̄ | PS$_1$ | PS$_0$ | 0C | 1C | 2C | 3C |
| 1 | 0 | 0 | 0 | 1 | 1 | 1 |
| 1 | 0 | 1 | 1 | 0 | 1 | 1 |
| 1 | 1 | 0 | 1 | 1 | 0 | 1 |
| 1 | 1 | 1 | 1 | 1 | 1 | 0 |
| 0 | — | — | 0 | 0 | 0 | 0 |

TABLE 4

| | | Decoder 28 | | | | |
|---|---|---|---|---|---|---|
| P/B̄ | BN$_1$ | BN$_0$ | C0 | C1 | C2 | C3 |
| 1 | — | — | 0 | 0 | 0 | 0 |
| 0 | 0 | 0 | 0 | 1 | 1 | 1 |
| 0 | 0 | 1 | 1 | 0 | 1 | 1 |
| 0 | 1 | 0 | 1 | 1 | 0 | 1 |
| 0 | 1 | 1 | 1 | 1 | 1 | 0 |

Taking the variation shown in FIG. 4, the pixel size is 4, the bus size 32, and the array has the dimensions of 4 pixels×8 columns. Each pixel has four bits, in each column no two logical bit positions are stored on the same physical bit line. Each cell has a pixel decoder 26 and a bit plane decoder 28, which in combination to set CAS lines 0C0–3C3 according to P/B̄, pixel select lines PS1 and PS0, and bit select lines BN1 and BN0.

Each memory device in FIG. 4 represents 4×1 DRAMs of the common type previously mentioned. RAS lines are not shown, but there is one for each row. CAS lines are activated in accordance with the logic shown with decoders 26 and 28. The individual CAS signals iCj are connected to every ith row and every jth bit in each pixel. Thus, to activate a row position of i, activate the row's RAS line and CAS lines iC0–iC3. Activating a bit map of position j requires all RAS lines be activated as well as all CAS lines 0Cj–3Cj.

The decoder 26 accepts the P/B̄ signal (pixel is high, bit plane is low) and the fifth and fourth most significant digits of the x-address as PS1 and PS0 which expresses the row number. The fifth and fourth are used because each row contains eight elements, so the first three bits address pixels in only that row, expressing the beginning column. PS1 and PS0 determine which of the four rows being addressed. This determines the row by activating (setting low) the appropriate iC lines if P/B̄ is high. If P/B̄ is low then all of 0C–3C lines are activated.

The decoder 28 accepts the inverted P/B signal (now bit plane is high, pixel is low) and Bit Number signals BN1 and BN0 which represent the bit position desired. This determines which bit is selected (when the inverted R/C is high) by activating the appropriate Cj line. If the inverted R/C signal is low, all the C0–C3 lines are activated.

In this manner, the generated iC and Cj signals are combined by OR gates. When P/B is high, this selects a row activated by lines iC0–iC3. When P/B is low, this selects a bit plane activated by 0Cj–3Cj. However, for all but Row 0, the word must be shifted to properly align the data.

For rows, except for row 0, each 4 bit nibble must be rotated around to be properly aligned. In FIG. 4's embodiment, the number of shifts required can be found by the following equation:

shifts = (row number) modulus bpp where ppW is pixles per work, in this case four.

For bit planes, a more complicated shift is required. The Y coordinate of each bit is constant, and x coordinates should be in ascending order from 0 to 31. Actually, the initial result will be 0, 8, 16, 24, 1, 9, 17, 25, . . ., 7, 15, 23, 31. Each bit must be shifted a different number of bits according to the equation:

shifts = 3* (X modulus 8) − 7* (X divide 8)

where divide produces an integral result. Bits 0–15 must shift that number left while bits 16–31 must shift that number right, with a negative number indicating a shift in the opposite direction.

Pixels, in the bit plane variation, have a different physical mapping of logical bits within the physical pixel storage than in the preferred embodiment. This is because bit plane representations are conventionally arranged such that the entire first bit row is comprised of a selected bit from each of the pixels in the first pixel row, and that is the first bit row of the bit plane. Thus, the 4×8 embodiment produces a 32 bit word which is the component of the first bit row of the bit plane. If Y was not held constant throughout the array, the maximum row size of the bit map would be the ppW or pixels per word. This is rarely the case, so generally bit planes must have a configuration similar to FIG. 4a.

THREE DIMENSIONAL ARRAY

FIG. 5 shows a three dimensional variation of the present invention. FIG. 5 is similar to FIG. 1, but in memory array cell 66 for every memory device D00–D33 in FIG. 1 there are four in FIG. 5. Each X, Y position has four possible Z positions. FIG. 5 shows the logical positions of each memory device D000–D333. RAS lines R0–R3 are coupled to every memory device, with R0 coupled to every device in the first row, R1 coupled to every device in the second row, R2 coupled to every device in the third row, and R3 coupled to every device in the fourth row. Each device is coupled to a CAS line iCjk. The CAS signals are generated by CAS decoder 25. CAS decoder 25 is described in more detail below. Each device D000–D333 is coupled to multiplexed address line MA. The devices in the first physical column, Dx0x, are coupled to the top 8 bits of data bus 54. Similarly the second (Dx1x), third (Dx2x), and fourth (Dx3x) physical columns are coupled to the data bus 54.

This variation uses a DRAM that does not have a TR/G pin. It is an extension of the preferred embodiment to an extra dimension, so that with a third dimension the array cell is 4×4×4 with 64 pixels. Every 4×4 array plane, whether taken along the X, Y, or Z dimension, has the property that no two logical row or column members share the same physical column. Thus, vectors along dimension within the cube can be accessed in one bus cycle.

Both X-rows and Z-columns lie on the same physical row, and share a common RAS line. The Y-columns are activated by all the RAS lines of the cell. However, to activate any one memory device, the specific iCjk line of the device must also be activated.

The iCjk lines are set in CAS decoder 25 of FIG. 5 according to the arrangement in FIG. 6. The CAS decoder 25 of FIG. 5 receives Dimension Input lines DM1 and DM0, as well as bit address lines 1X, 0X, 1Y, 0Y, 1Z, and 0Z. In FIG. 6, Dimension select 35 takes DM1 and DM0 as input and sets the appropriate dimension signal, X, Y, or Z. Decoders 21, 22, and 23 act in a similar fashion receiving a dimension signal and two bit address lines. Table 5 shows the truth table of the X decode 21, with the Y decode 22 and the Z decode 23 having similar truth tables. Each Xi, Yj, and Zk line is coupled with sixteen OR gates, for example X0 is coupled with all the OR gates coupled with CAS lines of the form 0Cjk. Each iCjk line is set according to the corresponding Xi, Yj, and Zk lines, as shown with OR gates 45, 46, and 47. If all are low then the OR gate produces a low (activated) signal. The Xi, Yj, and Zk lines are determined by decoders 21, 22, and 23 respectively. Each decoder receives a dimension input (either X, Y, or Z) and two inputs determined by the two least significant digits of the dimension's address, 1X, 0X, 1Y, 0Y, 1Z, and 0Z. For every X vector is defined by a unique (Y, Z) coordinate in the plane of 0 . . . ppW-1 by 0 . . . ppW-1, with Y and Z vectors defined similarly.

TABLE 5

| X | 1X | 2X | X Decoder 21 | | | |
|---|----|----|----|----|----|----|
|   |    |    | X0 | X1 | X2 | X3 |
| 1 | —  | —  | 0  | 0  | 0  | 0  |
| 0 | 0  | 0  | 0  | 1  | 1  | 1  |
| 0 | 0  | 1  | 1  | 0  | 1  | 1  |
| 0 | 1  | 0  | 1  | 1  | 0  | 1  |
| 0 | 1  | 1  | 1  | 1  | 1  | 0  |

Thus, an access to an X vector is accomplished as follows. The multiplex address is present on the address bus, and the RAS line of that row is activated. The iCyz lines of the X vector's y,z-plane are activated, that is, 0Cyz–3Cyz. This activates four memory devices of the same X-row.

To access a Y vector, all the RAS and appropriate CAS lines must be activated. The cell address is present on the multiplex address. The xCjz lines are activated, the ones which specify the Y vector desired. This produces a Y vector that has each physical memory device located on a different physical output line.

Z vectors have the property that every Z vector is located on one RAS CAS line pair. To access a Z vector, the RAS and appropriate CAS lines are activated while the cell address is on the multiplex address bus. The iCj0–iCj3 lines are activated. This sends the Z vector on the data bus.

N DIMENSIONAL ARRAY

The present invention can also be extended to four dimensions. This is accomplished by adding a new dimension and adding more control lines. Each memory device pictured in FIG. 5 would have three more devices attached to it, having the coordinates of (X, Y, Z, 0) [for the original], (X, Y, Z, 1), (X, Y, Z, 2), and (X, Y, Z, 3) [for the additional devices]. 256 iCjk lines would be necessary to be able to specify a space that would differentiate between conflicting vectors. The new dimension vectors would have a logical to physical mapping on each z-vector like that of the Z vectors on each x-vector. Extension of the present invention to n-dimensions can be generalized.

The generation of a new dimension can be done using the following method. A hyper-cube of dimensions $4 \times 4 \ldots \times 4$ is used. To start, every X vector is expanded. That is, for every point in the row four new points are substituted: $(i,j, \ldots, k, 0)$, $(i',j', \ldots, k',1)$, $(i'',j'', \ldots, k'',2)$, and $(i''',j''', \ldots, k''',3)$. The location of each point is referenced as its position in the two dimensional array of the XQ plane, where the plane is that defined by dimensions X and Q. Each point will have the position calculated by $\Sigma x$ modulus 4, where x ranges from $i,j,k, \ldots, q$, the numerical values of the coordinate indexes. That result is calculated modulus 4 because 4 is the width, in pixels, of the vector being expanded. The number of points substituted for every point in the expanded vector is based on the width of the new dimension.

An additional dimension Pixel Select decode is required, as well as an extended number of CAS lines. The new decode receives essentially an analogous set of inputs as the other dimension's decodes, namely a Q line from the Dimension Select decode with lines Q0 and Q1 that are the two least significant digits of the Q address. The new CAS lines are expansions of the previous iCj . . . k lines and are: iCj . . . k0, iCj . . . k1, iCj . . . k2, and iCj . . . k3. Each CAS line will only be activated when lines of the corresponding X, Y, Z, . . . , Q lines are activated, (i.e., iCjk . . . q is only activated when all of Xi, Yj, Zk, . . . , Qq are).

FIG. 7 shows a CAS signal generator for an array of N dimensions. Dimension select 101 receives inputs from m number of lines, where m is the $\log_2 N$ rounded up. Given the appropriate signals, the appropriate Dimension of $D_0-D_{N-1}$, is set. Dimension decoders 110, 111, and 119 work similarly to the truth table shown in Table 5, except that w number of bit address lines are input, where w is the $\log_2 ppW$ rounded up, or the smallest number of bits that can address a column of a memory cell. If the $D_x$ line is set then all the $D_x{}^y$ lines are activated. If the $D_x$ line is not set then only the $D_x{}^z$ line is set, where z is the number represented by the binary number formed by $PS_{(w-1)} \ldots PS_0$. The decoders have ppW number of outputs, where ppW is the number of pixels per word. OR gates 120, 121, and 129 have N number of inputs each which determine the activation of CAS signals. Each OR gate 95 is coupled so that the Xi, Yj, Zk, . . . , Qq determine the activation of CAS signal c(i, j, k, . . . , q).

The packed pixel/bit plane architecture can also be extended into a multi-dimensional case. Depending on the arrangement desired, there are a number of variations that can be made. The simplest is an N dimension matrix where each cell contains only members of the first logical row, that is the row having differing first coordinates and the same remaining coordinates. Either rows or bit planes can be accessed, with every bit plane defined by the third to Nth coordinates of the matrix. The number of shifts necessary to properly align each pixel sized piece of data in the bit plane is determined by the following equation:

$$\text{\# of shifts} = \Sigma(\text{indexes}) \text{ modulus } ppW$$

where $\Sigma$(indexes) is the sum of all the dimensional coordinates except that of the coordinate of the dimension which is being accessed.

In fact, there is no limit to the number of dimensions that can use variations of architecture of the present invention. Using the present invention, it is possible to construct architectures for any n-dimensional array. As long as vectors of every dimension are distributed so that no two elements of the same vector lie on the same data line, equally rapid access along any dimension can be achieved.

Thus, a bus architecture and memory array providing for rapid access along any dimensional vector is described.

I claim:

1. In a computer system, a dynamic random access memory array cell which comprises;

memory storage means of a logical array of logical rows and logical columns for storing data arranged in physical rows and physical columns such that each of said storage means of the same said physical column is coupled to and shares a section of a data bus line, where no two of said storage means of the same said logical column lies on the same said physical column;

a data bus coupled to said storage means and a bus interface means, said data bus partitioned into sections for transmitting data, such that each said section can carry said data contained in one of said storage means;

a multiplexed address bus coupled to a computer processor and each of said storage means for sending a coordinate address comprising a row address and a column address;

said bus interface means coupled to said storage means, said data bus, a decoder, and said computer processor, for enabling said storage means such that no more than one storage means per said section of said data bus is enabled, said bus interface means having a barrel shifter for shifting data from the data bus;

said computer processor coupled with said multiplex address bus and said bus interface means, said computer processor for generating coordinate addresses on said multiplex address bus;

decoder means coupled with said bus interface means for generating enable signals for said storage means.

2. In a computer system, a dynamic random access memory array comprising of memory array cells as described in claim 1 where said bus interface means has row access select (RAS) lines for enabling said storage means having a common row address and has a column access select (CAS) means for enabling said storage means having a common column address such that said storage devices can be accessed with pagemode or fast pagemode addressing.

3. The array as described in claim 1 where said decoder means creates memory device enabling signals by interpreting a row or column signal along with signals taken from the least significant bits of the row and column addresses located on the multiplex address bus.

4. The array claimed in claim 3 where each of said storage means lies on the same physical row, modulus as logical row, in a physical column position defined by {(logical row coordinate)+(logical column coordinate)} modulus (number of logical columns/in each cell) where the row and column coordinates are numbered consecutively starting at zero.

5. The array claimed in claim 4 where said storage means is a dynamic random access memory (DRAM) circuit.

6. The array claimed in claim 5 where said array has the dimensions of 4×4.

7. The array claimed in claim 6 where said storage means is an eight bit DRAM for storing pixel information.

8. The array claimed in claim 7 where each logical coordinate position is one pixel, said pixel information comprising 8 bits.

9. In a computer memory system, a dynamic random access memory array cell which comprises:
individual memory storage means of a logical array for storing data arranged in logical rows and logical columns such that each bit of each physical column is coupled to and shares a physical bit line of a data bus means, where no two bits of the same logical position lie on the same physical bit line of said data bus means;
said data bus means coupled to said storage means and a bus interface means for transmitting said bits;
a multiplexed address bus means coupled to a computer processor and each of said storage means for sending a coordinate address comprising a row address and a column address;
said bus interface means coupled to said storage means, said data bus means, said computer processor, and a decoding means for enabling said storage means such that no more than one storage means per said physical bit line is enabled, said bus interface means having a barrel shifting means for rotating and shifting data from the data bus means;
said computer processor coupled with said bus interface means and said multiplex address bus means, said computer processor for generating coordinated addresses on said multiplex address;
a decoder means coupled with said bus interface means for generating an enable signal for said storage means.

10. In a computer system, a dynamic random access memory array comprising of memory array cells as described in claim 9 where said bus interface means has row access select (RAS) lines for enabling said storage means having a common row address and has a column access select (CAS) means for enabling said storage means having a common column address such that said storage devices can be accessed with pagemode or fast pagemode addressing.

11. The array as described in claim 9 where said storage means is a dynamic random access memory (DRAM) circuit.

12. The array as claimed in claim 11 where said logical array has the row dimension of 4 and the column dimension of 8.

13. The array as claimed in claim 12 where said storage means is a one bit DRAM.

14. The array as claimed in claim 13 where said storage means are grouped for storing pixel information, said pixels comprising four bits, with each logical coordinate position represented by a group of four one bit DRAMs.

15. In a computer system, a dynamic random access memory array cell which comprises;
memory storage means of a logical array of three logical dimensional axes for storing data arranged in three physical dimensional axes such that each of said storage means of the first physical dimensional axis is coupled to and shares a section of a data bus line, where no two of said storage means of the same logical dimensional-axis vector lies on the same said first physical dimensional-axis;
a data bus coupled to said storage means and a bus interface means, said data bus partitioned into sections for transmitting data such that each said section can carry said data contained in one of said storage means;
a multiplexed address bus coupled to a computer processor and each of said storage means for sending a coordinate address comprising three addresses one for each physical dimensional axis;
said bus interface means coupled to said storage means, said data bus, a decoder, and said computer processor, for enabling said storage means such that no more than one storage means per said section of said data bus is enabled, said bus interface means having a barrel shifter for shifting data from the data bus;
said computer processor coupled with said multiplex address bus and said bus interface means, said computer processor for generating coordinate addresses on said multiplex address bus;
decoder means coupled with said bus interface means for generating enable signals for said storage means.

16. In a computer system, a dynamic random access memory array comprising of memory array cells as described in claim 15 where said bus interface means has row access select (RAS) lines for enabling said storage means having a common row address and has a column access select (CAS) means for enabling said storage means having a common column address such that said storage devices can be accessed with pagemode or fast pagemode addressing.

17. The array as described in claim 15 where said decoder means creates memory device enabling signals by interpreting dimension input signals and signals from the least significant bits of said coordinate address located on the multiplex address bus.

18. The array as described in claim 17 where each of said storage means
lies on the same second physical dimensional axis as second logical dimensional axis, in a first physical dimensional axis position defined by: {(first logical dimensional coordinate)+(the second logical dimensional coordinate)+(the third logical dimensional coordinate)} modulus (width of first dimensional axis) where said dimensional coordinates are numbered consecutively starting at zero and the width of the first dimensional-axis is the number of storage devices in each cell comprising said first dimensional-axis, which is also the number of sections of said data bus.

19. The array claimed in claim 18 where said storage means is a dynamic random access memory (DRAM) circuit.

20. The array claimed in claim 19 where said array has the dimensions of 4×4×4.

21. The array claimed in claim 20 where said storage means is an eight bit DRAM for storing pixel information.

22. The array claimed in claim 21 where each logical coordinate position is one pixel, said pixel information comprising 8 bits.

23. In a computer system, a dynamic random access memory array cell which comprises;
   memory storage means of a logical array of n logical dimensional axes for storing data arranged in n physical dimensional axes such that each of said storage means of the first physical dimensional axis is coupled to and shares a section of a data bus line, where no two of said storage means of the same logical dimensional-axis vector lies on the same said first physical dimensional-axis;
   a data bus coupled to said storage means and a bus interface means, said data bus partitioned into sections for transmitting data such that each said section can carry said data contained in one of said storage means;
   a multiplexed address bus coupled to a computer processor and each of said storage means for sending a coordinate address comprising addresses one for each physical dimensional axis;
   said bus interface means coupled to said storage means, said data bus, a decoder, and said computer processor, for enabling said storage means such that no more than one storage means per said section of said data bus is enabled, said bus interface means having a barrel shifter for shifting data from the data bus;
   said computer processor coupled with said multiplex address bus and said bus interface means, said computer processor for generating coordinate addresses on said multiplex address bus;
   decoder means coupled with said bus interface means for generating enable signals for said storage means.

24. In a computer system, a dynamic random access memory array comprising of memory array cells as described in claim 23 where said bus interface means has row access select (RAS) lines for enabling said storage means having a common row address and has a column access select (CAS) means for enabling said storage means having a common column address such that said storage devices can be accessed with pagemode or fast pagemode addressing.

25. The array as described in claim 23 where said decoder means creates memory device enabling signals by interpreting dimension signals and the least significant bits of said coordinate address located on the multiplex address bus.

26. The array as described in claim 25 where each of said storage means
   lies on the same second physical dimensional axis as second logical dimensional axis, in a first physical dimensional axis position defined by: $\Sigma$(logical dimensional axis coordinates) modulus (width of first dimensional axis) where said dimensional coordinates are numbered consecutively starting at zero and the width of the first dimensional-axis is the number of storage devices in each cell comprising said first dimensional-axis, which is also the number of sections of said data bus.

27. The array claimed in claim 26 where said storage means is a dynamic random access memory (DRAM) circuit.

28. The array claimed in claim 27 where said storage means is an eight bit DRAM for storing pixel information.

29. The array claimed in claim 28 when each logical coordinate position is one pixel, said pixel information comprising 8 bits.

* * * * *

UNITED STATES PATENT AND TRADEMARK OFFICE,
CERTIFICATE OF CORRECTION

PATENT NO.  : 4,983,958
DATED       : 1-8-91
INVENTOR(S) : Paul Carrick

It is certified that error appears in the above-identified patent and that said Letters Patent is hereby corrected as shown below:

Col. 12, Line 11    Delete "iC V Cj iCj"    Insert --iC V Cj —>> iCj--

Col. 12, Line 13    Inset -- —>>--           between qoutation marks

Signed and Sealed this

Twenty-second Day of February, 1994

Attest:

BRUCE LEHMAN

Attesting Officer    Commissioner of Patents and Trademarks